(12) United States Patent
Wang

(10) Patent No.: US 9,793,298 B2
(45) Date of Patent: Oct. 17, 2017

(54) MANUFACTURE METHOD OF TFT SUBSTRATE INVOLVING REDUCED NUMBER OF MASKS AND STRUCTURE OF TFT SUBSTRATE SO MANUFACTURED

(71) Applicant: Shenzhen China Star Optoelectronics Technology Co., Ltd., Shenzhen, Guangdong (CN)

(72) Inventor: Jun Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 15 days.

(21) Appl. No.: 14/427,631

(22) PCT Filed: Sep. 11, 2014

(86) PCT No.: PCT/CN2014/086258
§ 371 (c)(1),
(2) Date: Mar. 11, 2015

(87) PCT Pub. No.: WO2016/026177
PCT Pub. Date: Feb. 25, 2016

(65) Prior Publication Data
US 2016/0254279 A1    Sep. 1, 2016

(30) Foreign Application Priority Data
Aug. 20, 2014  (CN) .......................... 2014 1 0415830

(51) Int. Cl.
*H01L 27/12*    (2006.01)
(52) U.S. Cl.
CPC ........ *H01L 27/1225* (2013.01); *H01L 27/124* (2013.01); *H01L 27/127* (2013.01); *H01L 27/1288* (2013.01)

(58) Field of Classification Search
CPC ............... H01L 27/1288; H01L 27/124; H01L 27/1225; H01L 27/127
See application file for complete search history.

(56) References Cited

U.S. PATENT DOCUMENTS

| 2008/0044953 A1* | 2/2008 | Yang .................... H01L 27/1255 438/129 |
| 2011/0198602 A1* | 8/2011 | Nanbu .................... C23C 14/18 257/59 |

(Continued)

FOREIGN PATENT DOCUMENTS

| CN | 101819362 A | 9/2010 |
| TW | 201044464 A | 12/2010 |

*Primary Examiner* — Marcos D Pizarro
*Assistant Examiner* — Shannon Yi
(74) *Attorney, Agent, or Firm* — Andrew C. Cheng

(57) ABSTRACT

The present invention provides a manufacture method of a TFT substrate, and the method comprises steps of: step 1, forming a gate (21) on a substrate (1); step 2, depositing a gate isolation layer (3); step 3, depositing an oxide semiconductor layer (4) and a first photoresistor layer (5); step 4, taking the gate (21) as a mask to implement a back side expose to the first photoresistor layer (5); step 5, forming an island shaped oxide semiconductor layer (41), and removing the island shaped first photoresistor layer (51); step 6, forming an island shaped etching stopper layer (6); step 7, forming a source/a drain; step 8, depositing a protecting layer (8), a second photoresistor layer (9), and implementing gray scal exposure, development to the second photoresistor layer (9); step 9, forming a pixel electrode via (81) to implement ashing process to the second photoresistor layer (9); step 10, deposing a pixel electrode layer (10); step 11, removing the remaining second photoresistor layer (9'), and forming a pixel electrode (10'); step 12, implementing anneal process.

8 Claims, 5 Drawing Sheets

(56) References Cited

U.S. PATENT DOCUMENTS

| | | | |
|---|---|---|---|
| 2014/0070239 A1* | 3/2014 | Yang | G02F 1/1362 257/88 |
| 2014/0127891 A1* | 5/2014 | Chen | H01L 27/1225 438/586 |
| 2014/0159034 A1* | 6/2014 | Yang | H01L 27/1296 257/43 |
| 2015/0115264 A1* | 4/2015 | Kato | H01L 29/45 257/43 |
| 2016/0027886 A1* | 1/2016 | Yuan | H01L 29/78696 257/43 |

* cited by examiner

MANUFACTURE METHOD OF TFT SUBSTRATE INVOLVING REDUCED NUMBER OF MASKS AND STRUCTURE OF TFT SUBSTRATE SO MANUFACTURED

FIELD OF THE INVENTION

The present invention relates to a display technology field, and more particularly to a manufacture method of a TFT substrate and a structure thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

To be compared with a well developed TFT-LCD, an OLED based on the Organic Light Emitting Diodes is an active light emitting display, which possesses outstanding properties of self-illumination, high contrast, wide view angle (up to 170°), fast response, high luminous efficiency, low operation voltage (3-10V), ultra-thin (thickness smaller than 2 mm) and etc. The display devices utilizing OLED technology has possibility to have a lighter, thinner, charming appearance, more excellent color display quality, wider view range and greater design flexibility.

Thin Film transistors (TFT) are important components of a flat panel display which can be formed on a glass substrate or a plastic substrate. Generally, the tin film transistors are employed as light switching-on elements and driving elements utilized such as LCDs, OLEDs, Electrophoresis Displays (EPD).

The oxide semiconductor TFT technology is the most popular skill at present. Because the carrier mobility of the oxide semiconductor is 20-30 times of the amorphous silicon semiconductor. With the higher electron mobility, it is capable of magnificently raising the charging/discharging rate of TFT to the pixel electrodes to promote the response speed of the pixels and to realize faster refreshing rate. In the mean time, the line scan rate of the pixels also can be promoted to make the manufacture of the flat panel display having ultra high resolution become possible. In comparison with the Low Temperature Poly-silicon (LTPS), the oxide semiconductor manufacture process is simpler and possesses higher compatibility with the amorphous silicon process. It can be applicable to the skill fields of Liquid Crystal Display, Organic Light Emitting Display, Flexible Display and etc. Because it fits the new generation production lines and has possible applications for displays with Large, Middle and Small sizes. The oxide semiconductor has the great opportunity of application development.

Generally, the present TFT substrate structure comprises a substrate, a gate, a gate isolation layer, an oxide semiconductor layer, an etching stopper layer, a source/a drain, a pixel electrode layer and etc. In the manufacture procedures, the formation of each layer structure requires one photolithography process and each photolithography process comprises processes of film formation, lithography, etching, stripping and etc. The lithography process further comprises processes of photoresistor coating, exposure and development and each lithography process requires creating one mask. The process becomes verbose, the manufacture skill is complicated and the production efficiency is lower; the more amount of masks is required, the higher the production cost became; meanwhile, the more the processes are involved, and the accumulated yield issue gets more significant.

SUMMARY OF THE INVENTION

An objective of the present invention is to provide a manufacture method of a TFT substrate capable of simplifying and shortening the process procedure, raising the manufacture efficiency, reducing the amount of masks and the manufacture cost and raising the yield of products.

Another objective of the present invention is to provide a TFT substrate structure, which the process procedure is shorter, the manufacture efficiency is higher and the manufacture cost is lower.

For realizing the aforesaid objective, the present invention provides a manufacture method of a TFT substrate, comprising steps of:

step 1, providing a substrate and deposing a first metal layer on the substrate to form a gate;

step 2, deposing a gate isolation layer on the gate and the substrate;

step 3, sequentially deposing an oxide semiconductor layer and a first photoresistor layer on the gate isolation layer;

step 4, employing the gate as a mask to implement a back side expose to the first photoresistor layer to form an island shaped first photoresistor layer directly over the gate;

step 5, etching the oxide semiconductor layer according to a pattern of the island shaped first photoresistor layer to form an island shaped oxide semiconductor layer directly over the gate, and removing the island shaped first photoresistor layer;

step 6, deposing and patterning an etching stopper layer on the island shaped oxide semiconductor layer and the gate isolation layer to form an island shaped etching stopper layer on the oxide semiconductor layer;

a width of the island shaped etching stopper layer is smaller than a width of the island shaped oxide semiconductor layer; the island shaped etching stopper layer covers a central part of the island shaped oxide semiconductor layer and exposes two side parts of the island shaped oxide semiconductor layer;

step 7, deposing and patterning a second metal layer on the island shaped etching stopper layer and the gate isolation layer to form a source/a drain;

the source/the drain contact the two side parts of the island shaped oxide semiconductor layer to establish electrical connections;

step 8, sequentially deposing a protecting layer, a second photoresistor layer on the source/the drain and the island shaped etching stopper layer, and implementing gray scal exposure, development to the second photoresistor layer to correspondingly form a full exposure region in a position of forming a pixel electrode via and form a gray scal exposure region in a position of forming a pixel electrode;

step 9, removing the protecting layer under the full exposure region to form the pixel electrode via, and implementing ashing process to the second photoresistor layer to remove the gray scal exposure region;

step 10, deposing a pixel electrode layer on the remaining second photoresistor layer and the protecting layer;

step 11, removing the remaining second photoresistor layer and a part of the pixel electrode layer deposed thereon to form the pixel electrode;

the pixel electrode fills the pixel electrode via and contacts the source/the drain to establish electrical connections;

step 12, implementing anneal process to the substrate of the step 11.

Operations of the patterning are accomplished by photolithography process and etching process.

The island shaped oxide semiconductor layer is an IGZO semiconductor layer.

Material of the protecting layer is $SiO_2$ or SiON.

In the step 9, removing the protecting layer under the full exposure region is implemented by dry etching to form the pixel electrode via; the ashing process to the second photoresistor layer is further implemented by dry etching to remove the gray scal exposure region.

Material of the pixel electrode is ITO or IZO.

In the step 11, thickness difference between the remaining second photoresistor layer and the protecting layer is utilized to remove the remaining second photoresistor layer and the pixel electrode layer deposed thereon to form the pixel electrode by lift-off process.

The substrate is a glass substrate.

The present invention further provides a TFT substrate structure, comprising a substrate, a gate on the substrate, a gate isolation layer on the gate and the substrate, an island shaped oxide semiconductor layer directly over the gate on the gate isolation layer, an island shaped etching stopper layer on the island shaped oxide semiconductor layer, a source/a drain on the island shaped etching stopper layer and the gate isolation layer, a protecting layer on the source/the drain and the etching stopper layer and a pixel electrode on the protecting layer; a width of the island shaped etching stopper layer is smaller than a width of the island shaped oxide semiconductor layer and only a central part is covered; the source/the drain contact the two side parts to establish electrical connections; the protecting layer comprises a pixel electrode via located at one side of the island shaped oxide semiconductor layer, and the pixel electrode fills the pixel electrode via and contacts the source/the drain to establish electrical connections.

The substrate is a glass substrate, and the island shaped oxide semiconductor layer is an IGZO semiconductor layer, and material of the protecting layer is $SiO_2$ or SiON and material of the pixel electrode is ITO or IZO.

The benefits of the present invention are: according to the manufacture method of the TFT substrate of the present invention, by employing the gate as a mask to implement a back side expose to the first photoresistor layer to form an island shaped first photoresistor layer and implementing gray scal exposure to form the pixel electrode via and the pixel electrode, merely four masks are required for accomplishing the manufacture of the TFT substrate. The manufacture steps can be magnificently reduced. The process procedure is simplified. The process period is shortened. The manufacture efficiency is raised and in the mean time, the amount of the masks is reduced. The manufacture cost is decreased. The yield of products can be raised. Moreover, with utilizing the manufacture process of self alignment, the precision of the alignment is raised and the aperture ratio and the luminous efficiency can be promoted, too. According to the TFT substrate structure, the process procedure is shorter, the manufacture efficiency is higher and the manufacture cost is lower.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
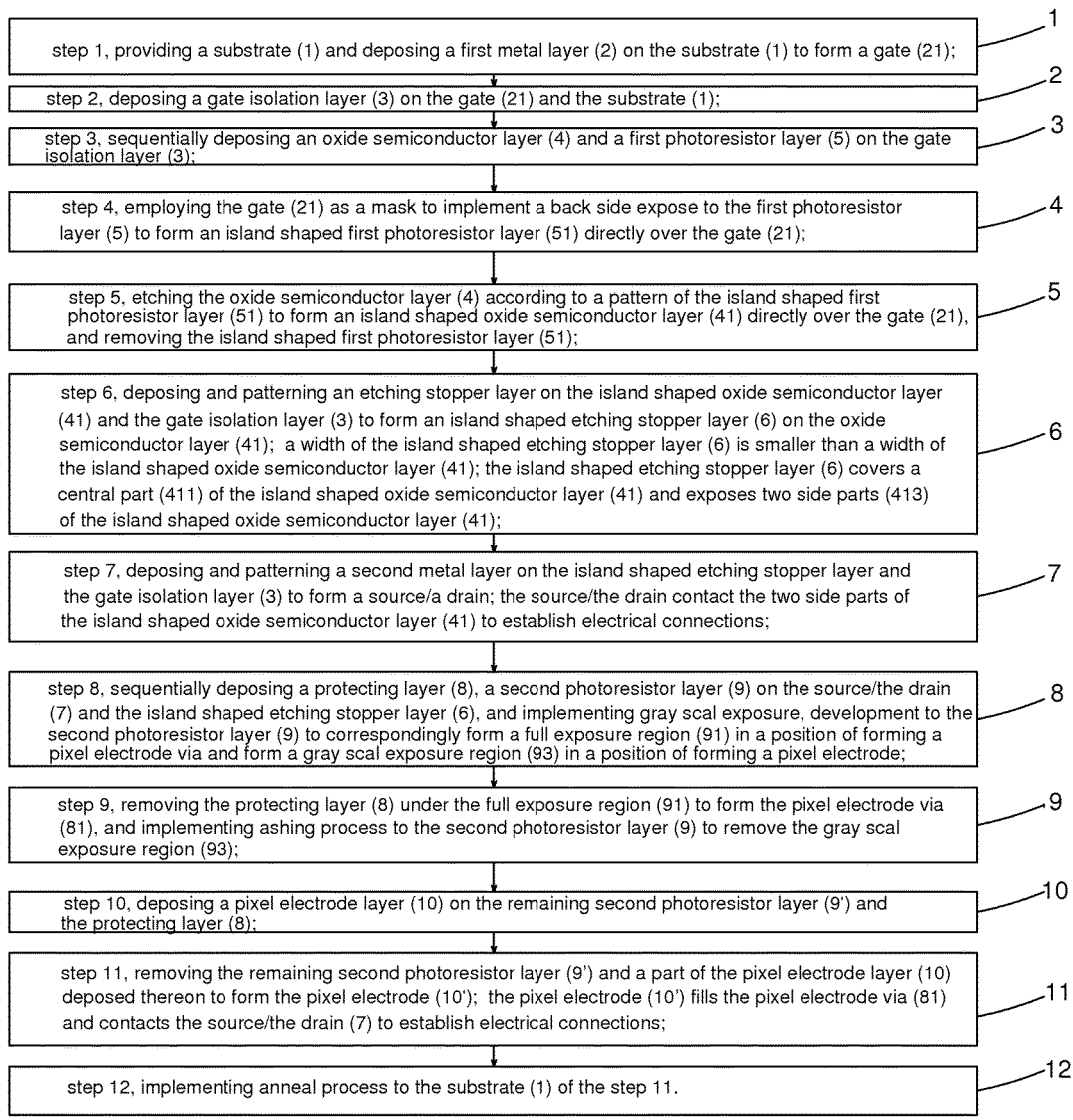
FIG. 1 is a flowchart of a manufacture method of a TFT substrate according to the present invention.
Figure 2:
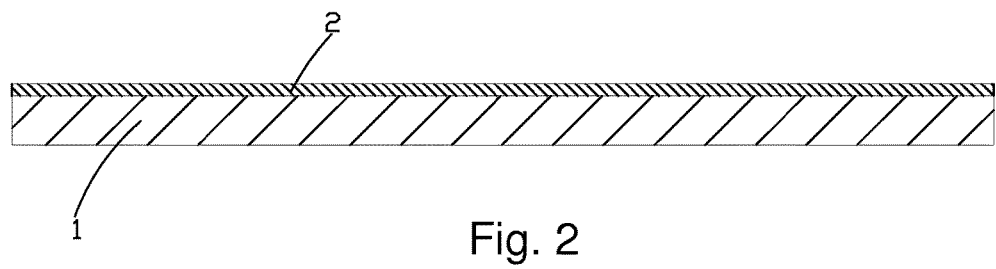
FIG. 2, FIG. 3 are diagrams of step 1 in the manufacture method of the TFT substrate according to the present invention.
Figure 3:
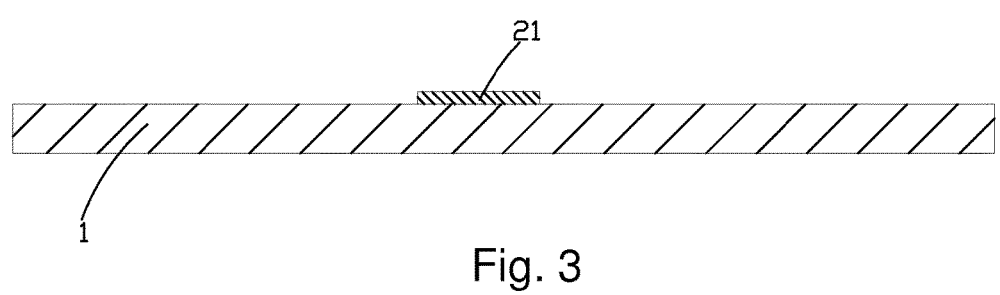

Please refer to FIG. 1, which is a flowchart of a manufacture method of a TFT substrate according to the present invention, comprising steps of:

step 1, please refer to FIG. 2, FIG. 3, providing a substrate 1 and deposing a first metal layer 2 on the substrate 1. With one general mask, the photolithography process and the etching process are implemented to pattern the first metal layer 2 to form a gate 21.

Figure 4:
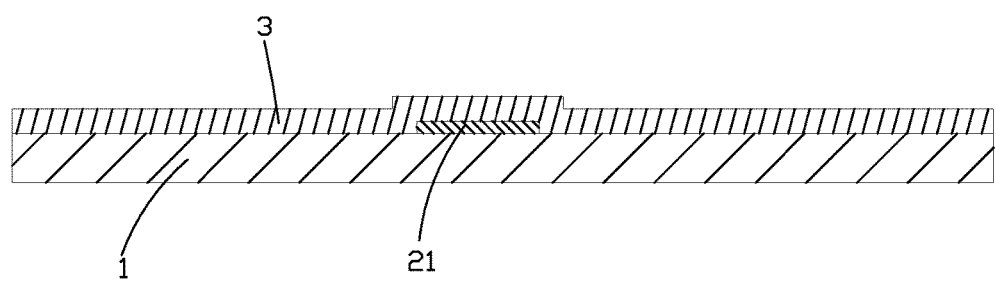
FIG. 4 is a diagram of step 2 in the manufacture method of the TFT substrate according to the present invention.

The substrate 1 is a transparent substrate. Preferably, the substrate 1 is a glass substrate.

step 2, please refer to FIG. 4, deposing a gate isolation layer 3 on the gate 21 and the substrate 1.

Figure 5:
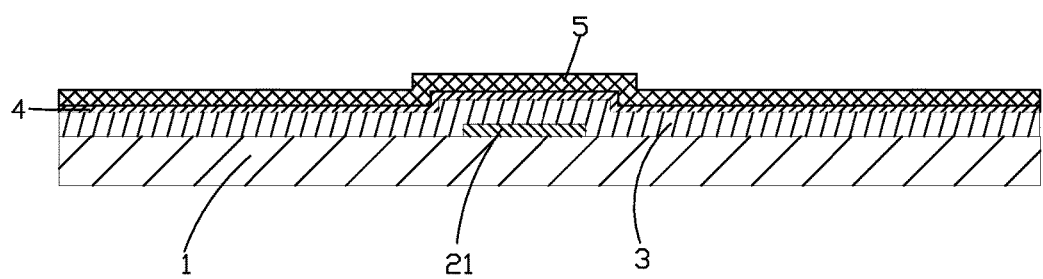
FIG. 5 is a diagram of step 3 in the manufacture method of the TFT substrate according to the present invention.

The gate isolation layer 3 covers the entire substrate 1.

step 3, please refer to FIG. 5, sequentially deposing an oxide semiconductor layer 4 and a first photoresistor layer 5 on the gate isolation layer 3.

Figure 6:
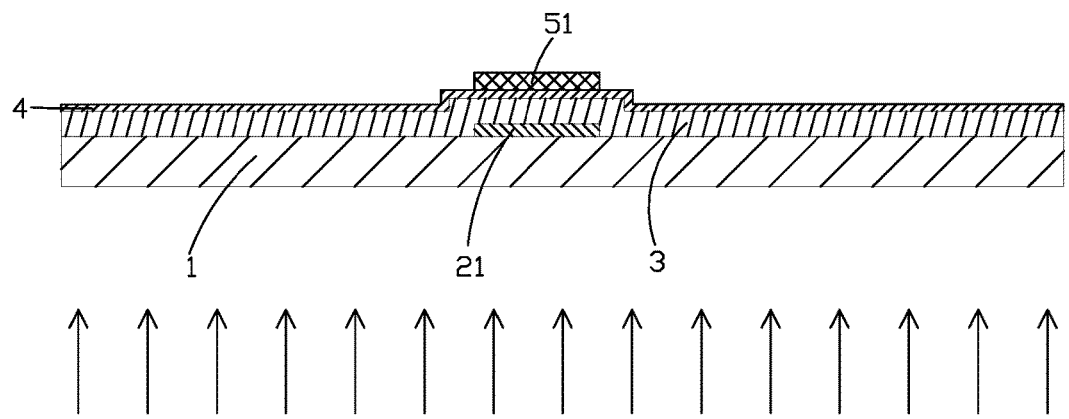
FIG. 6 is a diagram of step 4 in the manufacture method of the TFT substrate according to the present invention.

The island shaped oxide semiconductor layer is an Indium gallium zinc oxide (IGZO) semiconductor layer.

step 4, please refer to FIG. 6, employing the gate 21 as a mask to implement a back side expose to the first photoresistor layer 5 to form an island shaped first photoresistor layer 51 directly over the gate 21.

Figure 7:
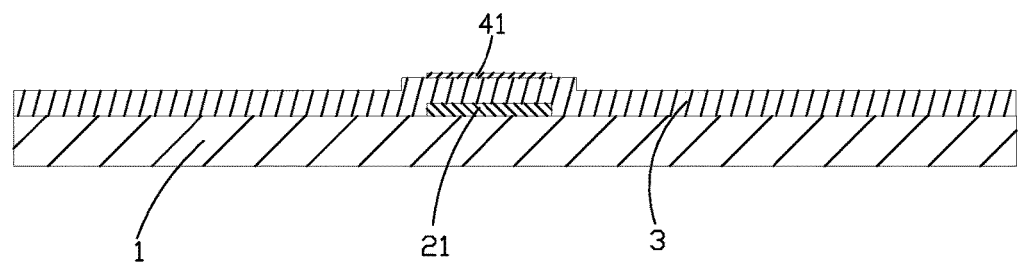
FIG. 7 is a diagram of step 5 in the manufacture method of the TFT substrate according to the present invention.

In the step 4, the light emits toward the photoresistor layer 5 from the bottom of the substrate. The gate 21 is employed as the mask to implement exposure to the photoresistor layer 5 and one mask procedure can be eliminated to simplify the process procedure, to shorten the process period and to reduce the manufacture cost. Meanwhile, the self alignment can be realized because the gate 21 is employed as the mask. The precision of the alignment is raised and the aperture ratio and the luminous efficiency can be promoted.

step 5, please refer to FIG. 7, etching the oxide semiconductor layer 4 according to a pattern of the island shaped first photoresistor layer 51 to form an island shaped oxide semiconductor layer 41 directly over the gate 21, and removing the island shaped first photoresistor layer 51 by lift-off process.

Figure 8:
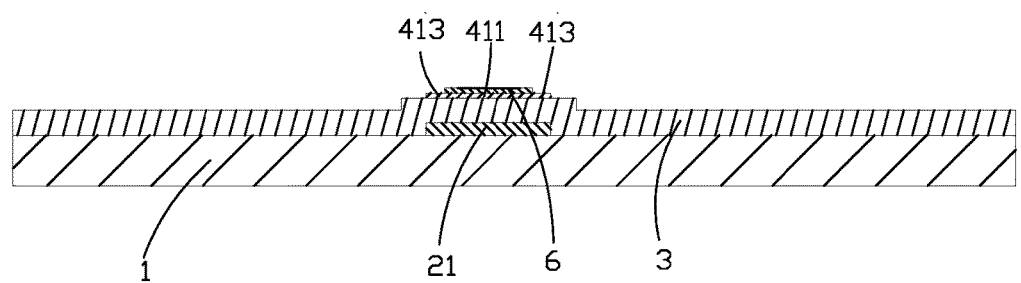
FIG. 8 is a diagram of step 6 in the manufacture method of the TFT substrate according to the present invention.

The island shaped oxide semiconductor layer 41 is an IGZO semiconductor layer.

step 6, please refer to FIG. 8, deposing an etching stopper layer on the island shaped oxide semiconductor layer 41 and the gate isolation layer 3. With one general mask, the photolithography process and the etching process are implemented to pattern the etching stopper layer to form an island shaped etching stopper layer 6 on the oxide semiconductor layer 41.

Figure 9:
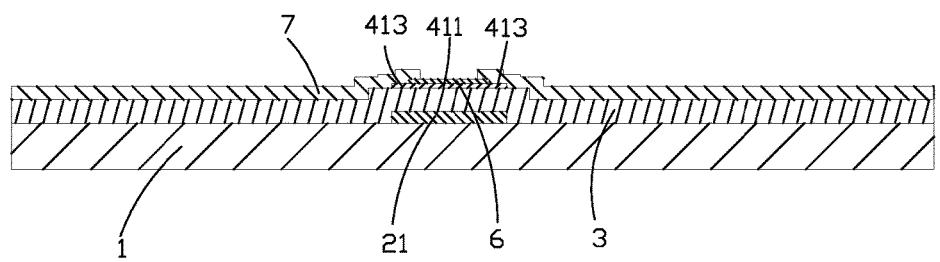
FIG. 9 is a diagram of step 7 in the manufacture method of the TFT substrate according to the present invention.

Furthermore, a width of the island shaped etching stopper layer 6 is smaller than a width of the island shaped oxide semiconductor layer 41; the island shaped etching stopper layer 6 covers a central part 411 of the island shaped oxide semiconductor layer 41 and exposes two side parts 413 of the island shaped oxide semiconductor layer 41.

step 7, please refer to FIG. 9, deposing a second metal layer on the island shaped etching stopper layer 6 and the gate isolation layer 3. With one general mask, the photolithography process and the etching process are implemented to pattern the second metal layer to form a source/a drain 7.

Figure 10:
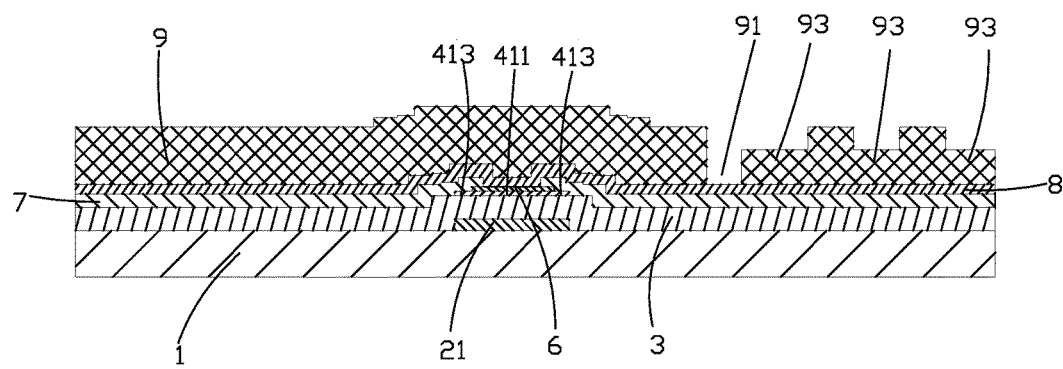
FIG. 10 is a diagram of step 8 in the manufacture method of the TFT substrate according to the present invention.

The source/the drain 7 contact the two side parts 413 of the island shaped oxide semiconductor layer 41 to establish electrical connections.

step 8, please refer to FIG. 10, sequentially deposing a protecting layer 8, a second photoresistor layer 9 on the source/the drain 7 and the island shaped etching stopper layer 6, and implementing gray scal exposure, development to the second photoresistor layer 9 to correspondingly form a full exposure region 91 in a position of forming a pixel electrode via and to form a gray scal exposure region 93 in a position of forming a pixel electrode.

The material of the protecting layer 8 is SiO2 or SiON.

Figure 11:
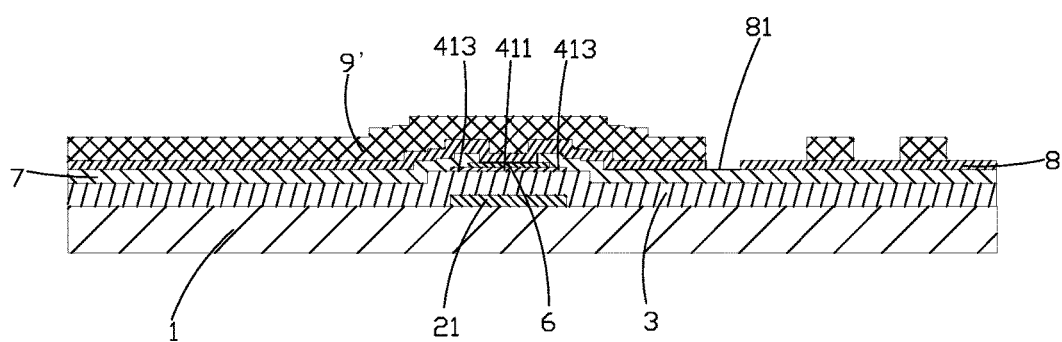
FIG. 11 is a diagram of step 9 in the manufacture method of the TFT substrate according to the present invention.
Figure 12:
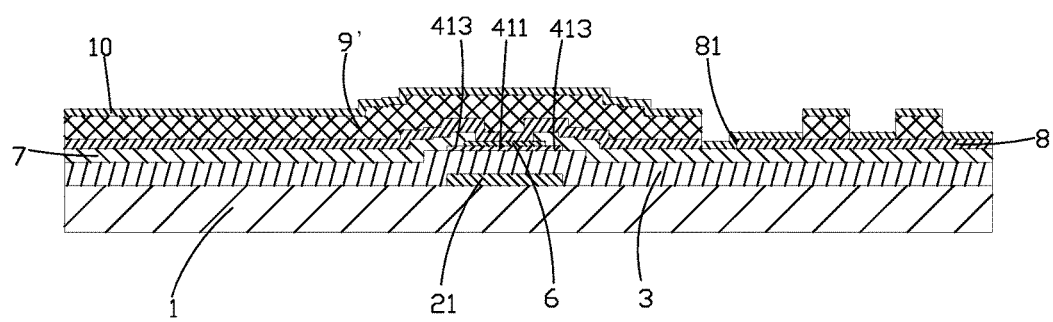
FIG. 12 is a diagram of step 10 in the manufacture method of the TFT substrate according to the present invention.

In the step 8, the gray scal exposure is implemented to the second photoresistor layer 9 and in the mean time, the patterns of the pixel electrode via, the pixel electrode of the protecting layer are defined. One mask procedure can be eliminated to simplify the process procedure, to shorten the process period and to reduce the manufacture cost. Meanwhile, the amount of the masks is reduced and the manufacture cost is decreased.

step 9, please refer to FIG. 11, removing the protecting layer 8 under the full exposure region 91 to form the pixel electrode via 81 by dry etching process to expose the surfaces of the source/the drain 7; the oxygen gas is injected, and implementing ashing process to the second photoresistor layer 9 to remove the gray scal exposure region 93 by dry etching process.

step 10, please refer to FIG. 12, deposing a pixel electrode layer 10 on the remaining second photoresistor layer 9' and the protecting layer 8.

Figure 13:
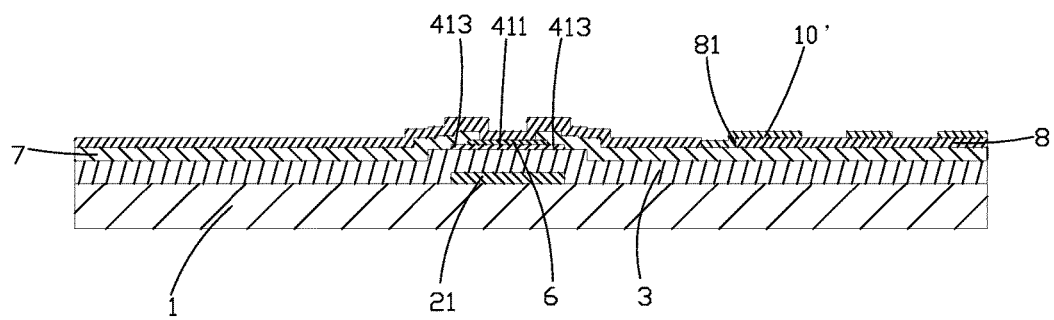
FIG. 13 is a diagram of step 11 in the manufacture method of the TFT substrate and a diagram of a TFT substrate structure according to the present invention.

The material of the pixel electrode layer 10 is Indium titanium oxide (ITO) or Indium zinc oxide (IZO).

step 11, please refer to FIG. 13, thickness difference between the remaining second photoresistor layer and the protecting layer is utilized to remove the remaining second photoresistor layer 9' and a part of the pixel electrode layer 10 deposed thereon to form the pixel electrode 10' by lift-off process.

Furthermore, the pixel electrode 10' fills the pixel electrode via 81 and contacts the source/the drain 7 to establish electrical connections.

The material of the pixel electrode 10' is ITO or IZO.

step 12, please refer to FIG. 13, implementing anneal process to the substrate 1 of the step 11 to accomplish the manufacture of the TFT substrate.

Please refer to FIG. 13. On the basis of the aforesaid manufacture method of the TFT substrate, the present invention further provides a TFT substrate structure, comprising a substrate 1, a gate 21 on the substrate 1, a gate isolation layer 3 on the gate 21 and the substrate 1, an island shaped oxide semiconductor layer 41 directly over the gate 21 on the gate isolation layer 3, an island shaped etching stopper layer 6 on the island shaped oxide semiconductor layer 41, a source/a drain 7 on the island shaped etching stopper layer 6 and the gate isolation layer 3, a protecting layer 8 on the source/the drain 7 and the etching stopper layer 6 and a pixel electrode 10' on the protecting layer 8.

The island shaped oxide semiconductor layer 41 comprises a central part 411 and two side parts 413; a width of the island shaped etching stopper layer 6 is smaller than a width of the island shaped oxide semiconductor layer 41 and only a central part 411 is covered; the source/the drain 7 contact the two side parts 413 to establish electrical connections. The protecting layer 8 comprises a pixel electrode via 81 located at one side of the island shaped oxide semiconductor layer 41, and the pixel electrode 10' fills the pixel electrode via 81 and contacts the source/the drain 7 to establish electrical connections.

The substrate 1 is a glass substrate, and the island shaped oxide semiconductor layer 41 is an IGZO semiconductor layer, and material of the protecting layer 8 is $SiO_2$ or SiON and material of the pixel electrode 10' is ITO or IZO.

In conclusion, according to the manufacture method of the TFT substrate of the present invention, by employing the gate as a mask to implement a back side expose to the first photoresistor layer to form an island shaped first photoresistor layer and implementing gray scal exposure to form the pixel electrode via and the pixel electrode, merely four masks are required for accomplishing the manufacture of the TFT substrate. The manufacture steps can be magnificently reduced. The process procedure is simplified. The process period is shortened. The manufacture efficiency is raised and in the mean time, the amount of the masks is reduced. The manufacture cost is decreased. The yield of products can be raised. Moreover, with utilizing the manufacture process of self alignment, the precision of the alignment is raised and the aperture ratio and the luminous efficiency can be promoted, too. According to the TFT substrate structure, the process procedure is shorter, the manufacture efficiency is higher and the manufacture cost is lower.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a thin-film transistor (TFT) substrate, comprising steps of:

step 1, providing a substrate and deposing and patterning a first metal layer on the substrate through a photolithographic process to form a gate;

step 2, deposing a gate isolation layer on the gate and the substrate;

step 3, sequentially deposing an oxide semiconductor layer and a first photoresist layer on the gate isolation layer such that the first photoresist layer is directly located on the oxide semiconductor layer;

step 4, employing the gate as a mask to implement a back side exposure operation to the first photoresist layer to form an island shaped first photoresist layer directly over the gate;

step 5, conducting a process of solely etching the oxide semiconductor layer according to a pattern of the island shaped first photoresist layer to form an island shaped oxide semiconductor layer directly over the gate, and removing the island shaped first photoresist layer that is used in the process of solely etching the oxide semiconductor to form the island shaped oxide semiconductor layer;

step 6, deposing and patterning an etching stopper layer on the island shaped oxide semiconductor layer, which is formed with the island shaped first photoresist layer, and the gate isolation layer to form an island shaped etching stopper layer on the oxide semiconductor layer;

wherein a width of the island shaped etching stopper layer is smaller than a width of the island shaped oxide semiconductor layer; and the island shaped etching stopper layer covers a central part of the island shaped oxide semiconductor layer and exposes two side parts of the island shaped oxide semiconductor layer;

step 7, deposing and patterning a second metal layer on the island shaped etching stopper layer and the gate isolation layer to form a source/a drain;

wherein the source/the drain contact the two side parts of the island shaped oxide semiconductor layer to establish electrical connections;

step 8, sequentially deposing a protecting layer and a second photoresist layer on the source/the drain and the island shaped etching stopper layer, and implementing gray scale exposure and development to the second photoresist layer to correspondingly form a full exposure region in a position of forming a pixel electrode via and form a gray scale exposure region in a position of forming a pixel electrode;

step 9, removing the protecting layer under the full exposure region to form the pixel electrode via, and implementing an ashing process to the second photoresist layer to remove the gray scale exposure region;

step 10, deposing a pixel electrode layer on the remaining second photoresist layer and the protecting layer;

step 11, removing the remaining second photoresist layer and a part of the pixel electrode layer deposed thereon to form a pixel electrode;

wherein the pixel electrode fills the pixel electrode via and contacts the source/the drain to establish electrical connections; and step 12, implementing an annealing process to the substrate.

2. The manufacture method of the TFT substrate according to claim 1, wherein operations of the patterning are accomplished by a photolithography process and an etching process.

3. The manufacture method of the TFT substrate according to claim 1, wherein the island shaped oxide semiconductor layer is an indium gallium zinc oxide (IGZO) semiconductor layer.

4. The manufacture method of the TFT substrate according to claim 1, wherein material of the protecting layer is $SiO_2$ or SiON.

5. The manufacture method of the TFT substrate according to claim 1, wherein in step 9, removing the protecting layer under the full exposure region is implemented by dry etching to form the pixel electrode via; and the ashing process to the second photoresist layer is further implemented by dry etching to remove the gray scale exposure region.

6. The manufacture method of the TFT substrate according to claim 1, wherein material of the pixel electrode is indium tin oxide (ITO) or indium zinc oxide (IZO).

7. The manufacture method of the TFT substrate according to claim 1, wherein in step 11, a thickness difference between the remaining second photoresist layer and the protecting layer is utilized to remove the remaining second photoresist layer and the pixel electrode layer deposed thereon to form the pixel electrode by a lift-off process.

8. The manufacture method of the TFT substrate according to claim 1, wherein the substrate is a glass substrate.

* * * * *